United States Patent [19]
Bowers

[11] Patent Number: 5,883,532
[45] Date of Patent: Mar. 16, 1999

[54] POWER-ON RESET CIRCUIT BASED UPON FET THRESHOLD LEVEL

[75] Inventor: Derek F. Bowers, Sunnyvale, Calif.

[73] Assignee: Analog Devices, Inc., Norwood, Mass.

[21] Appl. No.: 823,647

[22] Filed: Mar. 25, 1997

[51] Int. Cl.⁶ .............................. H03L 7/00; H03K 3/02
[52] U.S. Cl. ........................................... 327/143; 327/198
[58] Field of Search .................................... 327/142, 143, 327/198, 205, 206, 215, 219, 427, 434, 437

[56] References Cited

U.S. PATENT DOCUMENTS

| | | | |
|---|---|---|---|
| 4,754,166 | 6/1988 | Nagano | 327/143 |
| 5,039,875 | 8/1991 | Chang | 327/143 |
| 5,349,244 | 9/1994 | Confalonieri | 327/143 |
| 5,602,502 | 2/1997 | Jiang | 327/143 |

OTHER PUBLICATIONS

Paul Horowitz, Winfield Hill, *The Art of Electronics*, Cambridge University Press, New York, 1989, pp. 614–616.

*Primary Examiner*—My-Trang Nu Ton
*Attorney, Agent, or Firm*—Koppel & Jacobs

[57] ABSTRACT

A power-on reset circuit initiates a reset signal when the circuit's power supply voltage is low, and terminates the signal in response to the supply voltage exceeding a reset termination threshold that is based upon the greater of the threshold voltages for p-channel and n-channel FETs employed in the circuit. The reset termination threshold is preferably the sum of the greater FET threshold plus a safety margin, with the termination delayed by a predetermined period to ensure an adequate reset period, and a hysteresis feature added to ensure a stable reset termination.

18 Claims, 3 Drawing Sheets

5,883,532

POWER-ON RESET CIRCUIT BASED UPON FET THRESHOLD LEVEL

BACKGROUND OF THE INVENTION

1. Field of the Invention

This invention is related to the provision of a power-on reset signal for electronic circuits.

2. Description of the Related Art

Power is often supplied to electronic systems in a gradual fashion for a number of reasons, e. g., the need to limit in-rush currents, limits on power availability, etc. During the time that power gradually "ramps up", i.e., the power supply voltage increases to its final value, circuitry may toggle somewhat randomly, leaving an entire system in an unknown state when power has been fully supplied to a system. Furthermore, the rate at which power is supplied varies from system to system, as does the final value of the power supply voltage.

Power-on reset signals are used to ensure that an electronic circuit does not begin operation until the power supply voltage reaches a level that permits proper operation. Digital circuitry, from the lowest level of integration, such as the "glue" logic required to provide an interface between complex digital systems, to the highest levels of integration exemplified by the most complex microprocessors available, requires an "all clear" signal that indicates to the circuitry when operation may safely commence. Without such a signal the somewhat random toggling of digital circuitry that occurs during the time that power is gradually applied to the system could be interpreted as meaningful data or instructions, with possibly catastrophic consequences. A power-on reset signal may be employed to place registers and other circuits in a predetermined state, providing a baseline from which to operate and, possibly, suppressing undesirable output signals.

FIG. 1 illustrates a conventional approach to creating a power-on reset signal. A delay circuit 2 includes a resistor 3 and a capacitor 6 connected in series between a positive voltage supply terminal $V_{dd}$ and a negative voltage supply terminal nominally designated as ground (gnd), with the resistor/capacitor (RC)'s tap connected to the input of an inverter 4. The capacitor 6 is connected between the inverter input and ground. As the power supply voltage (between Vdd and ground) increases, the tap voltage of the RC follows it. Once the RC tap voltage reaches the input HIGH threshold voltage of the inverter, the inverter output POR goes low, thus providing an active low power-on reset signal which, ostensibly, indicates that the power supply voltage has reached a level which is acceptable for normal circuit operation.

In fact, this circuit provides the power-on reset signal only indirectly. The voltage at the input of the inverter 4 does not directly track the power supply voltage. That is, the voltage at the inverter input is not a fixed ratio of the power supply voltage; rather it is a delayed version of it. The voltage at the inverter input depends upon the RC time constant, not directly upon the input voltage. Some RC time constant after $V_{dd}$ passes the inverter's input threshold, the delayed version of the power supply voltage at the inverter input reaches the inverter's input HIGH threshold voltage. If the capacitor 6 is too small, the input voltage could reach the inverter's threshold before the power supply voltage has reached an adequate level. Because it is important to be sure that the power supply voltage has reached its minimum acceptable level before commencing operation, the capacitor 6 is often chosen to be quite large. Consequently, the resistor 3 and capacitor 6 are typically large, discrete components.

One problem with using a large capacitor is that the power-on reset circuitry must respond to disturbances to the power supply that, although brief, may be of sufficient magnitude to upset and invalidate the logic states of the circuitry. To accommodate these limited-duration power supply disturbances, often referred to as "brown outs", a diode 7 is connected across the resistor 3 so that it is reverse-biased during normal operation but rapidly drains the capacitor 6 when the power supply voltage falls more than a diode drop below the voltage across the capacitor.

Even with the addition of the diode, however, the capacitor's selection presents a compromise between a capacitor that is large enough to assure a valid POR signal for the initial application of power, whether rapid or gradual, and one that permits a response to relatively brief power disturbances. Because it is impractical to produce large capacitors within integrated circuits (ICs) and because the rate at which power is applied to a system varies widely from application to application, this conventional circuit requires the use of external components, i.e., components not located within the IC, with all their attendant cost and reliability problems.

A complicating factor is that, in complementary metal-oxide-semiconductor (CMOS) circuits employing p-channel and n-channel field effect transistors (FETs), the threshold voltages for operation of the p-channel and n-channel devices are generally independent of each other, and can vary widely within a range of approximately 0.6–1.2 volts due to processing variations. This makes it very difficult to predict an accurate level for the termination of a power-on reset signal. If the signal is terminated at a voltage below the level at which all of the FETs are operative, the circuit may not function properly. If it is terminated significantly above the threshold levels, any circuit operation at all is sacrificed until the reset termination level is reached.

For the forgoing reasons, there is a need for a power-on reset indicator that eliminates external components, improves reliability, reduces cost and ensures, regardless of the rapidity with which power is supplied to the circuit, that the power supply voltage has reached a safe operating level before indicating to other circuitry that operation may commence.

SUMMARY OF THE INVENTION

The invention is directed to power-on reset circuitry which produces a reliable indication that a power supply voltage has reached a safe operating level. It seeks to achieve this end while improving reliability, reducing cost and reducing the amount of required circuitry.

The new power-on reset circuit employs an initiation circuit that initiates a reset signal when the power supply voltage rises above a reset initiation level, and a reset termination circuit that includes p-channel and n-channel FETs with respective threshold voltages Vtn and Vtp and terminates the reset signal in response to the power supply voltage reaching a termination threshold that is substantially greater than the reset initiation level, and at least equal to the greater of Vtp and Vtn.

In a preferred embodiment a voltage margin circuit cooperates with the reset termination circuit to terminate the reset signal in response to the supply voltage equaling the sum of a predetermined margin voltage and the greater of Vtp and Vtn. A delay circuit which delays the termination of the reset signal until a period after the supply voltage has reached the above sum is also included in the preferred embodiment. Hysteresis circuitry can also be employed to ensure a stable reset termination by establishing a lower level for restoration of the reset signal, when the supply voltage drops, than the termination threshold.

The new power-on reset circuit is particularly suitable for integrated circuit applications, since no large capacitors or other passive components are required. The circuit may, for example, be employed within an integrated circuit digital-to-analog converter (DAC) to place all of the DAC's registers in a known state at the time power is applied to the DAC. In many applications, each time power is applied to a circuit a controller is forced to "zero out" all the registers of all the DACs and other peripheral circuitry with which it interacts. The new power-on reset circuit eliminates this time-consuming and burdensome activity from the controller's duties.

These and other features, aspects and advantages of the invention will be apparent to those skilled in the art from the following detailed description, taken together with the accompanying drawings.

DETAILED DESCRIPTION OF THE INVENTION

Rather than relying upon a time delay, the new power-on reset circuit employs a voltage threshold sensing circuit, including a p-channel FET and an n-channel FET, to sense the circuit's power supply voltage, i.e., the voltage across high and low power terminals, and release a reset control in response to the power supply voltage exceeding the greater of the p-channel and n-channel threshold voltages. The circuit is particularly suited to the control of CMOS circuits, but is also applicable to other kinds of circuitry. Since the power-on reset circuit is preferably integrated on the same chip as the CMOS circuitry which it controls and is therefore subject to the same processing variations, the threshold voltages of the power-on reset FETs will tend to be the same as for the same type of FETs in the controlled circuitry. This enables the setting of a power-on reset termination level that closely approximates the operating threshold of the controlled circuit.

Figure 2:
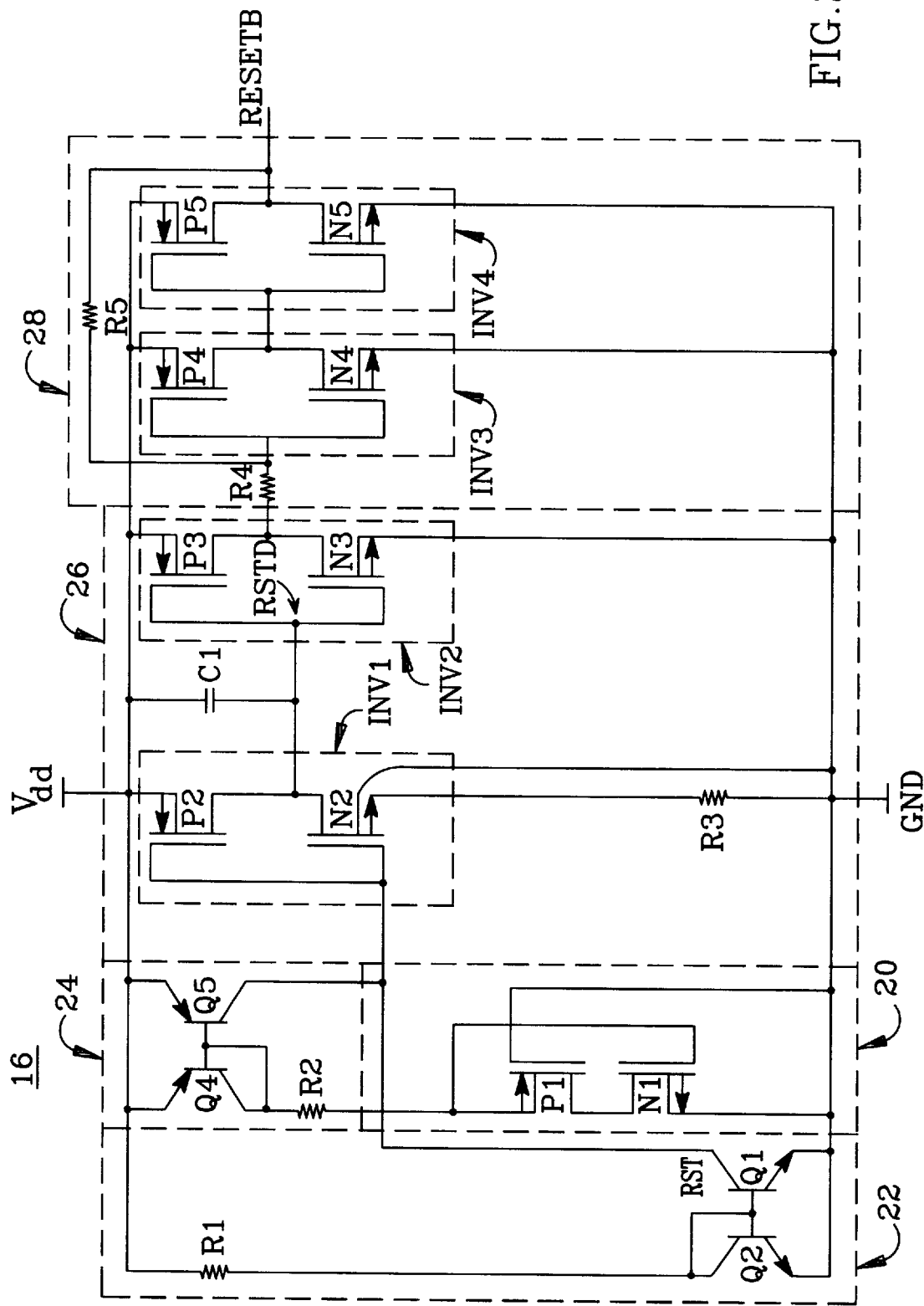
FIG. 2 is an electrical schematic diagram of the new power-on reset circuit.

In the preferred embodiment of the new power-on reset circuit 16 of FIG. 2, a threshold voltage sensing circuit 20 is accompanied by a reset pulse initiation circuit 22 and a voltage margin circuit 24. The reset pulse initiation circuit 22, as will be described in greater detail below, initiates a reset pulse signal RST which is terminated by the threshold voltage sensing 20 and voltage margin 24 circuits. The preferred embodiment includes a delay circuit 26 that is connected to add a time delay to the RST signal, and a hysteresis circuit 28 which ensures a stable reset output signal, available at a terminal RSTB.

The reset pulse initiation circuit 22 initiates a power-on reset pulse when the supply voltage rises above a reset initiation level, which in the preferred embodiment is the base-emitter forward bias voltage for a bipolar transistor. The threshold voltage sensing circuit 20 includes a pair of FETs, one p-channel and one n-channel, with their sources and gates cross-coupled, and their source-drain circuits connected in series between Vdd and gnd. The FETs conduct current in response to the voltage across them from the power supply reaching the greater of the p-channel and n-channel threshold voltages, Vtp and Vtn. At this supply voltage level both FETs are operational. Furthermore, once the supply voltage reaches this threshold other CMOS circuitry receiving power from the same power supply should also be capable of proper operation. This condition, i.e., conduction through cross-coupled FETs, is employed to terminate the reset pulse initiated by the reset pulse initiation circuit 22. An offset, or margin, voltage is added to the above threshold voltage by the voltage margin circuit 24 to account for the possibility of fabrication tolerances, so that the reset pulse is not terminated until the power supply voltage reaches a level equal to the sum of the offset voltage and the higher of the FET threshold voltages, Vtp and Vtn.

The preferred reset initiate circuit 22 includes a bipolar transistor current mirror, comprising PNP transistors Q1 and Q2, connected to mirror a current to the voltage margin circuit 24 through the collector of transistor Q1. So long as the power supply voltage remains less than the reset termination threshold, i.e., the sum of the offset voltage and the greater of the FET threshold voltages, the cross-coupled FETs of circuit 20 will not conduct and the mirrored current from the reset initiate circuit 22 will hold the circuit output at an active reset level, which is logic low in the preferred embodiment. When the supply voltage reaches the reset termination threshold voltage, the voltage margin circuit supplies sufficient current to the reset initiate circuit current mirror to force the reset signal RST to change state.

Although the reset signal RST may be employed by itself, in the preferred embodiment the delay circuit 26 is employed to delay termination of the reset pulse beyond the time the power supply voltage reaches the reset termination threshold voltage. The delay circuit produces a delayed output RSTD. This delay is designed to ensure that a reset pulse of sufficient length issues, even when the power supply voltage is rapidly applied. Since this delay is measured from the time the safe operating voltage is reached, not from the time power is first supplied to the circuit, the uncertainty associated with conventional delay circuits is avoided. Additionally, because the power supply may be interrupted, e.g., during a brownout, for a brief period of time, the preferred delay circuit 26 is asymmetric. That is, the delay between the assertion of RST and the assertion of RSTD is greater than the delay between the de-assertion of RST and the de-assertion RSTD when the supply voltage falls back through the reset termination threshold. This asymmetry prevents activation of the reset pulse for brief interruptions to the power supply. A hysteresis circuit 28 is driven by the signal RSTD and employs positive feedback to establish separate high and low threshold voltages for RSTD, thereby providing sharp, well-defined and stable transitions for the reset signal RESETB.

Turning now to a detailed description of the various circuits, the reset initiate circuit 22 includes a pair of npn transistors Q1 and Q2 connected as a current mirror, with their emitters connected to the low supply terminal (nominally designated gnd), their bases connected to one another, and the collector of transistor Q2 coupled through a resistor R1 to the high supply terminal Vdd. When power is supplied to the circuit 16 and Vdd reaches a voltage slightly higher than the base-emitter voltage of transistor Q2

(typically 0.6V), transistor Q2 turns on and conducts a collector current of approximately (Vdd−Vbe2)/R1, where Vbe2 is the base-emitter voltage of transistor Q2. This current is reflected in transistor Q1, whose collector provides the intermediate reset signal RST and is connected to draw current from the voltage margin circuit 24.

The voltage margin circuit 24 includes a pair of pnp transistors Q4 and Q5 connected as another current mirror, with their emitters connected to the high supply terminal Vdd. Transistor Q4 is diode connected and its collector is connected, through a resistor R2, to the cross-coupled FETs of the threshold voltage sensing circuit 20. The collector of transistor Q5 is connected to the collector of transistor Q1. Since transistors Q2' and Q1 turn on when the supply voltage is slightly greater than Vbe2, transistor Q1 will attempt to drain a current equal to (Vdd−Vbe2)/R1 from the collector of transistor Q5. Until transistor Q5 begins conducting, transistor Q1 holds the RST signal at the Q5 collector low, thus initiating a reset pulse.

Since transistors Q4 and Q5 are connected as a mirror, Q5 will not begin conducting until transistor Q4 does. Additionally, transistor Q4 will not turn on until the cross-coupled FETs P1 and N1 of the threshold voltage sensing circuit 20 provide a conduction path for Q4's collector current. The cross-coupled FETs P1 and N1 have their drains connected to one another and their sources connected to the resistor R2 and gnd, respectively. The gate of each FET is connected to the other FET's source. In this way, when the voltage across the FETs'sources exceeds the greater of the FET threshold voltages, Vtp and Vtn, both FETs turn on and conduct current from resistor R2 to gnd. (Even in the absence of the voltage margin circuit, this would not normally happen until Vdd has exceeded the base-emitter turn-on voltage of bipolar transistor Q1.) Consequently, assuming transistors Q4 and Q5 and transistors Q1 and Q2 have equal base-emitter junction areas, transistor Q5's collector current will just equal that of transistor Q1 when the supply voltage Vdd equals Vbe4+R2(Vdd−Vbe1)/R1 plus the greater of Vtp or Vtn. The signal RST switches at this level of Vdd. That is, for greater values of Vdd the collector current of Q5 will exceed that of transistor Q1 and RST is forced high, terminating the reset pulse. The voltage margin circuit 24 therefore provides a voltage margin of Vbe4+R2 (Vdd−Vbe1)/R1 by which the supply voltage must exceed the voltage required for proper CMOS circuit operation. Different voltage margins may be established by, for example, employing different base-emitter area ratios.

As noted above, the intermediate reset signal RST may be employed as a power-on reset signal. However, if the supply voltage ramps up very rapidly, the reset pulse generated at the RST terminal may be very short, or even non-existent. In the preferred embodiment the delay circuit 26 is used to ensure that a reset pulse signal is generated, even if the supply voltage reaches its nominal value virtually instantaneously. The delay circuit 26 includes serially-connected inverters INV1 and INV2, a capacitor C1 connected between the output of inverter INV1 and the supply Vdd, and a resistor R3. As explained in greater detail below, the basic delay is formed by discharging the capacitor C1 through the resistor R3.

Inverters INV1 and INV2 include n-channel FETs N2 and N3 and p-channel FETs P2 and P3, respectively. The inverters' respective p-channel and n-channel gates are tied together, as are their respective drains, and the p-channel and n-channel sources are coupled to Vdd and gnd, respectively. Additionally, the FET gates form the inverter inputs and the drains provide the inverter outputs. The intermediate reset signal RST is connected to the input of inverter INV1, the source of FET N2 is connected through resistor R3 (typically 200 kΩ) to gnd, and the output of the inverter INV1 is connected to one terminal of capacitor C1 (typically 20 pF), which is connected at its other terminal to the positive supply terminal Vdd.

During a power-on sequence, when the pulse initiation circuit 22 initiates a pulse the input to inverter INV1 is pulled LOW and p-channel FET P2 turns on, shorting the capacitor C1 and discharging it through the channel of FET P2. In the preferred embodiment, the channel width-to-length ratio of FET P2 is 100/3. When the intermediate reset pulse signal RST is terminated the input to inverter INV1 goes HIGH, turning n-channel FET N2 on and charging the capacitor C1 through the resistor R3. In the preferred embodiment, FET N2 is much "weaker" than FET P2; that is, FET N2 has a channel width-to-length ratio of only 20/3. Therefore FET P2 discharges the capacitor much faster than the FET N2 can charge it. To eliminate resistor R3, FET N2 could be made weaker still. After a delay determined by the values of R3 and C1, the input to inverter INV2 will go LOW and the output will go HIGH. Thus, the inverter INV2 restores the sense of the signal RST after a delay period, e.g., after RST reaches a logic HIGH, terminating the reset pulse; the RSTD output of inverter INV2 also reaches a logic HIGH.

During a power-down sequence the body diode of FET N2 rapidly discharges the capacitor C1 so that, should power be restored very quickly, e.g., during a brownout, C1 may again be charged through the resistor R3, thereby providing a delayed reset pulse. That is, since the body of FET N2 is connected to the low power supply terminal gnd, as long as its drain is maintained at a higher voltage than the source it is also at a higher voltage than the body, and the drain/body junction remains reverse-biased. However, when the DC supply voltage is removed the body diode between the FET's body and drain will be forward-biased and discharge the capacitor C1. An asymmetry is thus produced for the delay period, with the delay in terminating the reset signal during power up exceeding the delay in restoring the reset signal during power down.

Should the supply voltage increase too rapidly, the capacitor C1 acts as a feedforward capacitor, producing a logic HIGH signal at the input to the inverter INV2 for a period which, as described above, is determined by the C1/R3 combination. That is, if power is rapidly applied to the circuit 16, the transistor Q2 may not have time to turn on and initiate a reset pulse. In such a case, the capacitor C1 will effectively short the power supply terminal Vdd to the input of the inverter INV2. When Vdd appears at the input to inverter INV2 a reset pulse is initiated. The capacitor is slowly discharged through the relatively weak n-channel FET N2 and resistor R3 when the input of inverter INV1 is driven HIGH, thus terminating the reset pulse.

The optional hysteresis circuit 28 includes a pair of inverters INV3 and INV4, which include p-channel and n-channel FETs P4, P5 and N4, N5 respectively. The input to INV3 is coupled through a relatively low-valued resistor R4, typically 10 Kohm, to the output of the inverter INV2. A higher valued resistor R5, typically 100 Kohm, is connected between the input of inverter INV3 and the output of INV4, which is also the hysteresis circuit's output RESETB. If the power supply voltage increases very slowly, the voltage at the output of inverter INV2 may linger at an indeterminate voltage for some time, one at which both FETs P4 and N4 would be conducting. The resistor network comprising resistors R5 and R4 forms a positive feedback loop which creates distinct high and low input threshold voltages for the inverter INV3 so that the reset termination is maintained until Vdd has dropped to a hysteresis level below the reset termination threshold, thereby eliminating the indeterminate voltage levels at stages subsequent to the inverter INV2.

Figure 3:
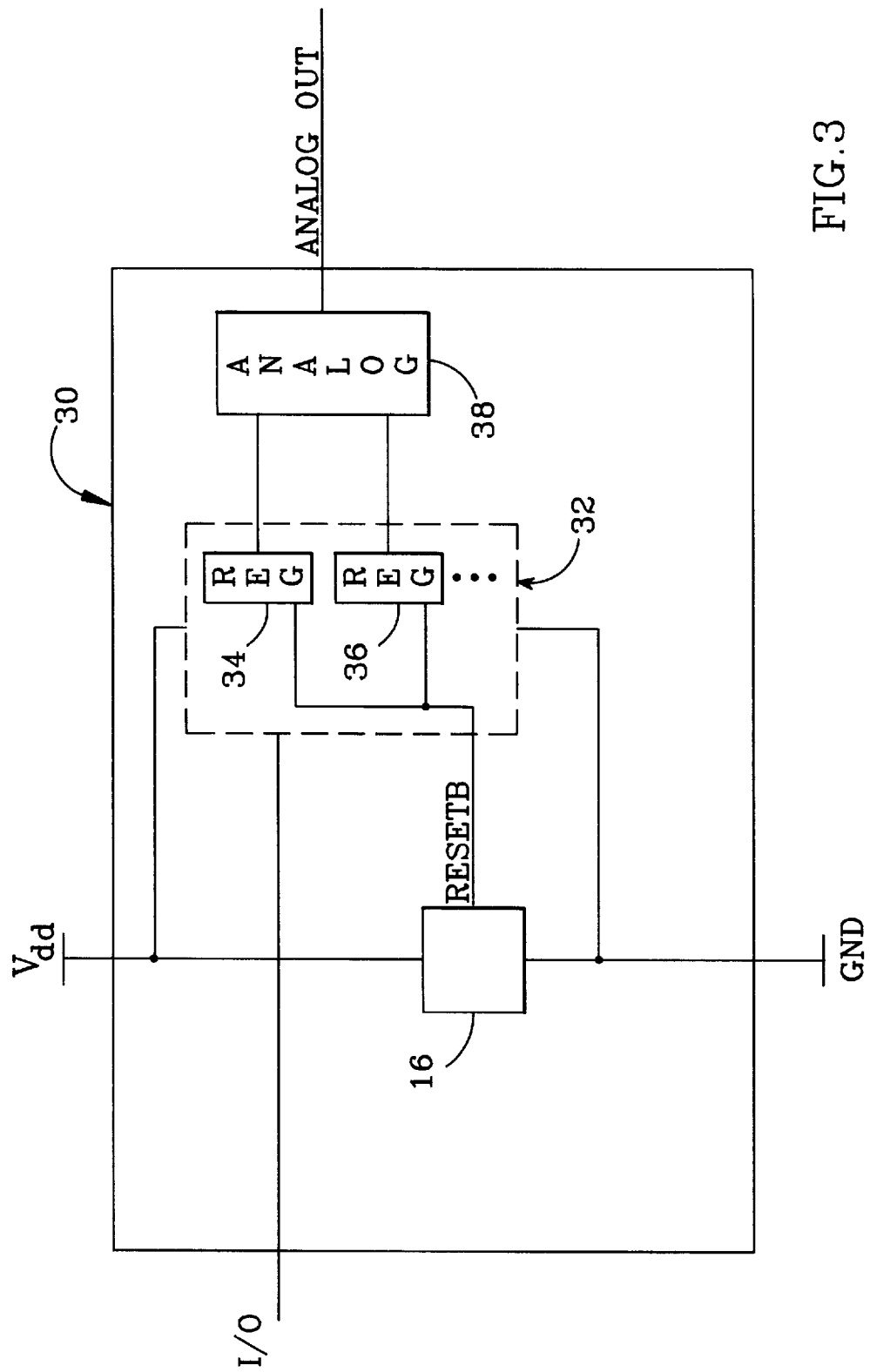
FIG. 3 is a block diagram of a DAC which incorporates the new power-on reset circuit.

The block diagram of FIG.3 illustrates a DAC 30 which employs the new power-on reset circuit 16. Digital signals are exchanged between the DAC and other circuitry (not shown) through the digital interface, labeled I/O. Digital circuitry 32 within the DAC derives power from the same power supply terminals Vdd and gnd as the power-on reset circuit 16. The digital circuitry 32 includes registers 34 and 36 which typically employ CMOS flip-flop circuits (described below in connection with FIGS. 4a and 4b), and which are connected to an analog circuit section 38. The analog circuit section generally includes voltage references and resistor ladders which are combined to produce an analog output signal, labeled ANALOG OUT, that corresponds to the digital values stored within the registers 34,36. DACs and the interaction between such digital and analog circuit sections are known. For a discussion of resistor ladders and their application to DACs, see Paul Horowitz, Winfield Hill, *The Art of Electronics*, Second Edition, Cambridge University Press, New York, 1991, pp 614–616.

The reset signal RESETB is distributed to the digital circuitry 32 from the reset circuit 16. In the preferred embodiment the reset signal is used to set digital values within the registers 34, 36 to respective predetermined values, typically zero. Since the digital interface I/O may be a relatively slow serial interface and there may be many DACs such as DAC 30 controlled by a microprocessor within a given system, this automatic presetting of the registers 34, 36 to predetermined values relieves the microprocessor of the potentially significant and time-consuming burden of setting all of the registers in all of the DACs to a preferred initial value. In the absence of the hysteresis circuit 28 the output of inverter INV2 would be applied to the registers, while in the absence of the delay circuit 26 the RST signal would be used.

Figure 1:
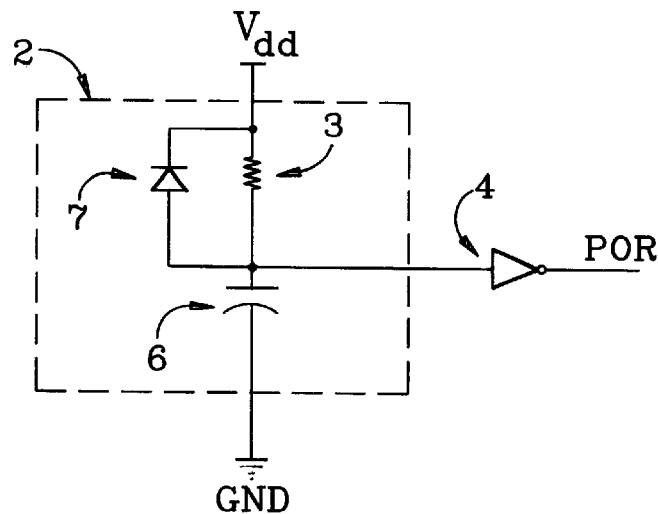
FIG. 1 is an electrical schematic diagram of a conventional power-on reset circuit.
Figure 4A:
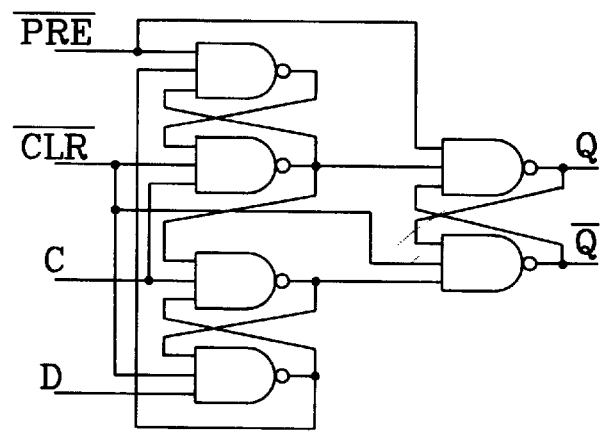
FIGS. 4a and 4b are respectively a block diagram of a flip-flop circuit that can be controlled by the new power-on reset circuit, and an electrical schematic diagram of a CMOS NAND gate that can be used as a building block for the flip-flop circuit.
Figure 4B:
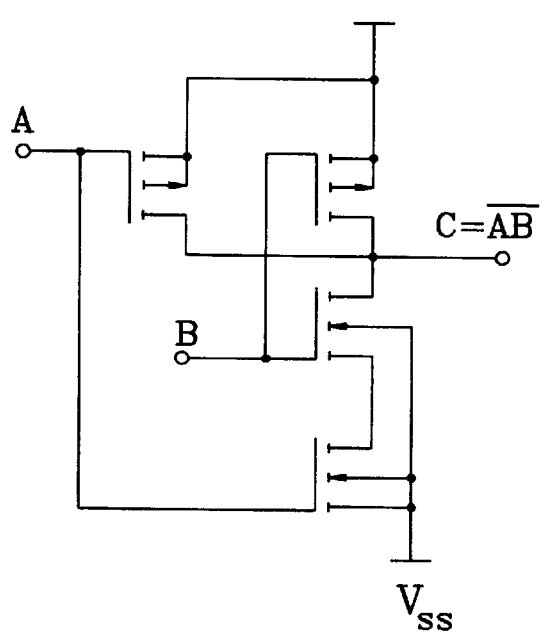

A conventional positive edge-triggered D flip-flop circuit that can be used in the DAC registers, with six interconnected NAND gates, is shown in FIG. 4a. The internal circuitry of a conventional two-input CMOS NAND gate, with two p-channel and two n-channel FETs, is shown in FIG. 4b. When expanded to three inputs, six of these circuits can be used to implement the flip-flop of FIG. 4a.

While particular embodiments of the invention have been shown and described, numerous variations and alternate embodiments will occur to those skilled in the art. For example, bipolar transistors of the opposite polarity may be substituted for those shown, with appropriate inversion of circuitry. Additionally, an active high reset pulse may be generated rather than the active low signal illustrated. Accordingly it is intended that the invention be limited only in terms of the appended claims.

I claim:

1. A power-on reset circuit for circuitry that is powered by a supply voltage Vdd, comprising:
    an initiation circuit having an output state that initiates a reset signal when Vdd rises above a reset initiation level; and
    a reset termination circuit that includes p-channel and n-channel FETs characterized by respective threshold voltages Vtp and Vtn and that is connected to alter the output state of said initiation circuit so as to terminate said reset signal in response to Vdd reaching a termination threshold that is substantially greater than said reset initiation level, said reset termination circuit comprising a pair of said p-channel and n-channel FETs with their sources and gates cross-coupled and their source-drain circuits connected in series between high and low power supply terminals.

2. The power-on reset circuit of claim 1, further comprising:
    a voltage margin circuit which, together with said reset termination circuit, terminates said reset signal in response to Vdd equaling the sum of a predetermined voltage margin and the greater of Vtp and Vtn.

3. The power-on reset circuit of claim 2, wherein said voltage margin circuit includes a diode-connected bipolar transistor connected in series with a resistor between Vdd and said reset termination circuit.

4. The power-on reset circuit of claim 2, further comprising:
    a time delay circuit which, together with said reset termination and voltage margin circuits, terminates said reset signal a predetermined time delay after Vdd equals said sum.

5. The power-on reset circuit of claim 1, further comprising:
    a time delay circuit which, together with said reset termination circuit, terminates said reset signal a predetermined time delay after Vdd equals said power on threshold.

6. The power-on reset circuit of claim 1, further comprising:
    a hysteresis circuit which, together with said reset termination circuits, maintains said reset signal termination until Vdd has dropped to a hysteresis level below said reset termination threshold.

7. A power-on reset circuit for circuitry supplied with power from high and low power terminals, comprising:
    a reset initiation circuit connected to produce an output state which initiates a reset pulse, and
    cross-coupled n-channel and p-channel field effect transistors (FETs) connected in series between said high and low power terminals so that both of said FETs conduct in response to the voltage across their series connection exceeding the greater of the p-channel and n-channel FET thresholds Vtp and Vtn, respectively, said FETs being further connected to alter the output state of said reset initiation circuit when they conduct so as to terminate said reset pulse.

8. The power-on reset circuit of claim 7, wherein the gate of each of said cross-coupled FETs is connected to the source of the other FET.

9. The power-on reset circuit of claim 8, further comprising:
    a voltage margin circuit which produces an offset voltage Voff, said voltage margin circuit together with said cross-coupled FETs inhibiting said FETs from conducting until the voltage across said high and low power terminals exceeds the greater of Voff+Vtp and Voff+Vtn.

10. The power on reset circuit of claim 8, further comprising:
    a hysteresis circuit connected to maintain said cross-coupled FETs in a conductive state until the voltage across said FETs has dropped to a hysteresis level below the greater of Vtp and Vtn.

11. The power-on reset circuit of claim 8, further comprising:

a delay circuit which, together with said cross-coupled FETs, delays said cross-coupled inverter's termination of said reset signal.

12. The power on reset circuit of claim 11, wherein said delay circuit delays the restoration of said reset signal, when the voltage across the series-connected FETs drops below the greater of Vtp and Vtn, by a delay period that is less than the delay in the termination of said reset signal.

13. A digital to analog converter (DAC) which derives power from a power source having a supply voltage Vdd, comprising:

a digital circuit section including CMOS circuitry composed of p-channel and n-channel field effect transistors (FETs) characterized by respective threshold voltages Vtp and Vtn, said digital circuit section connected to receive digital data, an analog output section connected to produce analog output signals corresponding to the digital value of said digital data, an initiation circuit having an output state that initiates a reset signal that resets said digital circuit section when Vdd rises above a reset initiation level less than the greater of Vtp and Vtn, and a reset termination circuit that includes p-channel and n-channel FETs with their sources and gates cross-coupled and their source-drain circuits connected in series between high and low power supply terminals, said FETs characterized by said respective threshold voltages Vtp and Vtn, and that is connected to alter the output state of said initiation circuit so as to terminate said reset signal in response to Vdd reaching a power-on threshold that is at least equal to the greater of Vtp and Vtn.

14. The DAC of claim 13, further comprising:

a voltage margin circuit which, together with said reset termination circuit, terminates said reset signal in response to Vdd equaling the sum of said power-on threshold and a predetermined margin.

15. The DAC of claim 14, wherein said voltage margin circuit includes a diode-connected bipolar transistor connected in series with a resistor between Vdd and said reset termination circuit.

16. The DAC of claim 14, further comprising:

a time delay circuit which, together with said reset termination and voltage margin circuits, terminates said reset signal a predetermined time delay after Vdd equals said sum.

17. The DAC of claim 13, further comprising:

a time delay circuit which, together with said reset termination circuits, terminates said reset signal a predetermined time delay after Vdd equals said power-on threshold.

18. The DAC of claim 13, wherein said digital circuit section includes registers which store digital data, said registers connected to be set to respective predetermined values by the application of said reset signal.

* * * * *